(12) United States Patent
Wehner et al.

(10) Patent No.: US 8,143,687 B2
(45) Date of Patent: Mar. 27, 2012

(54) MULTI-BAND, REDUCED-VOLUME RADIATION DETECTORS AND METHODS OF FORMATION

(75) Inventors: Justin G. A. Wehner, Santa Barbara, CA (US); Scott M. Johnson, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 274 days.

(21) Appl. No.: 12/640,586

(22) Filed: Dec. 17, 2009

(65) Prior Publication Data

US 2011/0147877 A1      Jun. 23, 2011

(51) Int. Cl.
*H01L 27/146* (2006.01)

(52) U.S. Cl. ........ 257/446; 257/448; 257/461; 257/465; 257/E31.039; 257/E31.093; 257/E27.143; 438/73; 438/81

(58) Field of Classification Search ................... 257/446, 257/448, 461, 465, E31.039, E31.093, E27.143; 438/73, 81

See application file for complete search history.

(56) References Cited

U.S. PATENT DOCUMENTS

| | | | |
|---|---|---|---|
| 3,971,065 A | 7/1976 | Bayer | |
| 4,783,594 A | 11/1988 | Schulte et al. | |
| 5,113,076 A | 5/1992 | Schulte | |
| 5,559,336 A | 9/1996 | Kosai et al. | |
| 5,731,621 A | 3/1998 | Kosai | |
| 5,959,339 A | 9/1999 | Chapman et al. | |
| 6,049,116 A | 4/2000 | Park et al. | |
| 7,135,698 B2 | 11/2006 | Mitra | |
| 7,145,124 B2 * | 12/2006 | Garrood et al. | ............ 250/208.1 |
| 2007/0145273 A1 | 6/2007 | Chang | |

OTHER PUBLICATIONS

Krishna, et al., "Quantum Dot Infrared Sensors with Photonic Crystal Cavity," Proceedings of the Laser and Electro-optical Society, vol. 1, pp. 909-910, Dec. 5, 2005.

* cited by examiner

*Primary Examiner* — Tu-Tu Ho
(74) *Attorney, Agent, or Firm* — Lando & Anastasi, LLP

(57) ABSTRACT

A broadband radiation detector includes a first layer having a first type of electrical conductivity type. A second layer has a second type of electrical conductivity type and an energy bandgap responsive to radiation in a first spectral region. A third layer has the second type of electrical conductivity type and an energy bandgap responsive to radiation in a second spectral region comprising longer wavelengths than the wavelengths of the first spectral region. The broadband radiation detector further includes a plurality of internal regions. Each internal region may be disposed at least partially within the third layer and each internal region may include a refractive index that is different from a refractive index of the third layer. The plurality of internal regions may be arranged according to a regularly repeating pattern.

20 Claims, 3 Drawing Sheets

MULTI-BAND, REDUCED-VOLUME RADIATION DETECTORS AND METHODS OF FORMATION

TECHNICAL FIELD

This invention relates generally to radiation detectors, and more particularly to multi-band, reduced-volume radiation detectors and methods of formation.

BACKGROUND

Infrared detectors are used in a variety of applications. For example, some infrared detectors are used in the military field, remote sensing, and infrared astronomy research. Infrared detectors are negatively affected by a variety of noise sources. Moreover, some infrared detectors are cooled to operating temperatures near or below that of liquid nitrogen (77K) to reduce noise, such as, noise caused by thermally excited current carriers.

SUMMARY OF THE INVENTION

Broadband radiation detectors and methods of forming the same are disclosed. According to one embodiment, a broadband radiation detector includes a first layer having a first electrical conductivity type. A second layer has a second electrical conductivity type and an energy bandgap responsive to radiation in a first spectral region. A third layer has approximately the second electrical conductivity type and an energy bandgap responsive to radiation in a second spectral region of longer wavelength than the first spectral region. The broadband radiation detector further includes a plurality of internal regions. In certain embodiments, each internal region may be disposed at least partially within the third layer. Each of the plurality of internal regions may include a dielectric constant that is different from a dielectric constant of the third layer. In particular embodiments, each of the plurality of internal regions comprises one or more of an organic polymer, a silicon compound, and an air gap. In various embodiments, the plurality of internal regions may be arranged according to a regularly repeating pattern.

In a method embodiment, a method of forming a broadband radiation detector includes forming a first layer having a first electrical conductivity type. The method further includes forming a second layer having a second electrical conductivity type and an energy bandgap responsive to radiation in a first spectral region. The method also includes forming a third layer having approximately the second electrical conductivity type and an energy bandgap responsive to radiation in a second spectral region. In this particular embodiment, the second spectral region comprises at least one wavelength that is longer than a wavelength in the first spectral region. The method includes, selectively removing portions of the third layer. In this example, the portions selectively removed from the third layer are arranged with respect to each other according to a regularly repeating pattern. The method also includes, partially filling each of the portions selectively removed from the third layer with a passivation layer having a refractive index that is substantially different from a refractive index of the third layer.

Particular embodiments disclosed herein may provide one or more technical advantages. For example, various embodiments may be capable of providing clear image, broadband infrared detection due at least in part to enhanced noise mitigation. Particular embodiments may be capable of broadband infrared detection at operational temperatures at or below that of liquid nitrogen (approximately 77 Kelvin) and up to a desired operating temperature, such as, for example an operating temperature within the range of approximately 200 to 250 Kelvin. Certain embodiments may provide enhanced performance within the various spectral regions. Certain embodiments may provide all, some, or none of these advantages. Certain embodiments may provide one or more other advantages, one or more of which may be apparent to those skilled in the art from the figures, descriptions, and claims included herein.

BRIEF DESCRIPTION OF THE DRAWINGS

For a more complete understanding of the present invention and advantages thereof, reference is now made to the following description taken in conjunction with the accompanying drawings, in which.

DESCRIPTION OF EXAMPLE EMBODIMENTS

Various example embodiments disclosed herein are explained in the context of radiation detectors and methods of formation. Certain embodiments may provide enhanced performance within multiple infrared spectral regions. Various embodiments may be capable of providing broadband infrared detection at higher operating temperatures due at least in part to enhanced noise mitigation. As explained further below, particular embodiments may provide noise mitigation at least in part by volume reduction of noisier bandgap regions within the infrared detectors. Although various example embodiments disclosed herein are explained in the context of multi-band, reduced-volume, infrared detectors and methods of formation, the teachings of the present disclosure could be applied to any of a variety of alternative radiation detectors including, for example, photodiodes, photoconductive detectors, photovoltaic detectors, photodiode detectors, or any other suitable radiation detector responsive to a variety of different spectral regions. Additionally, particular embodiments disclosed herein may be implemented using any number of techniques, whether currently known or in existence. The present disclosure should in no way be limited to the example implementations, detector materials, drawings, and techniques illustrated below. Additionally, the drawings are not necessarily drawn to scale.

Figure 1A:
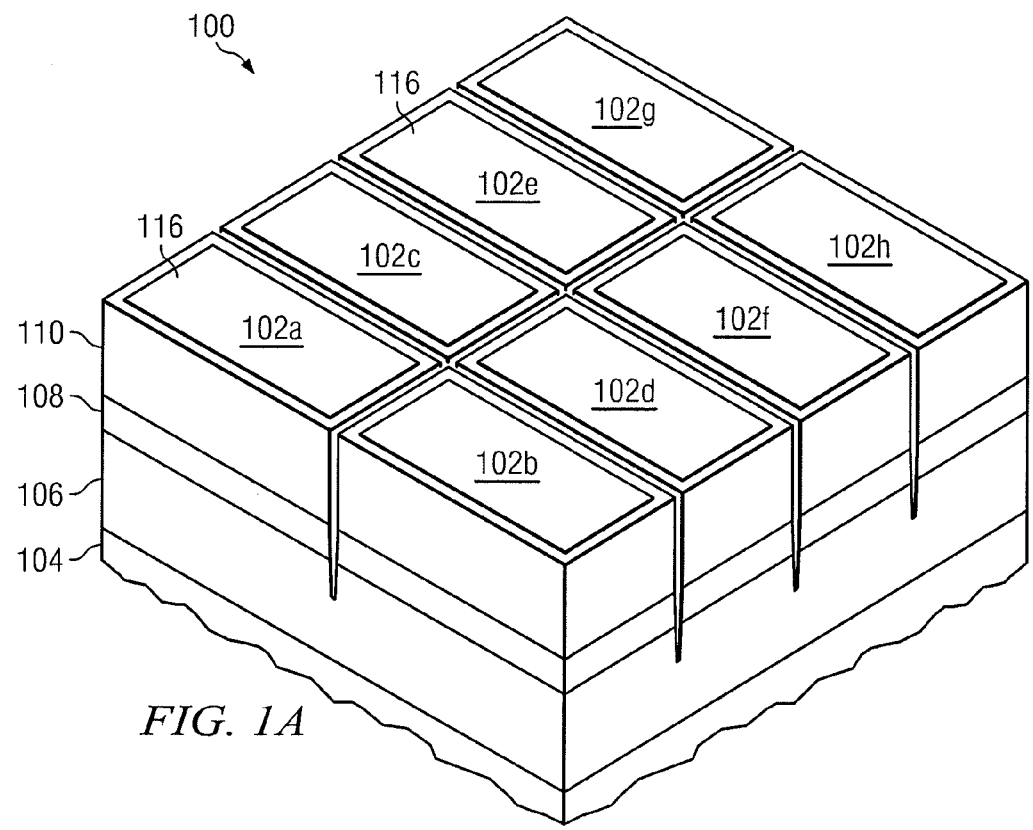
FIG. 1A is a perspective view of one example embodiment of a portion of focal-plane array of multi-band, reduced-volume, infrared detectors.
Figure 1B:
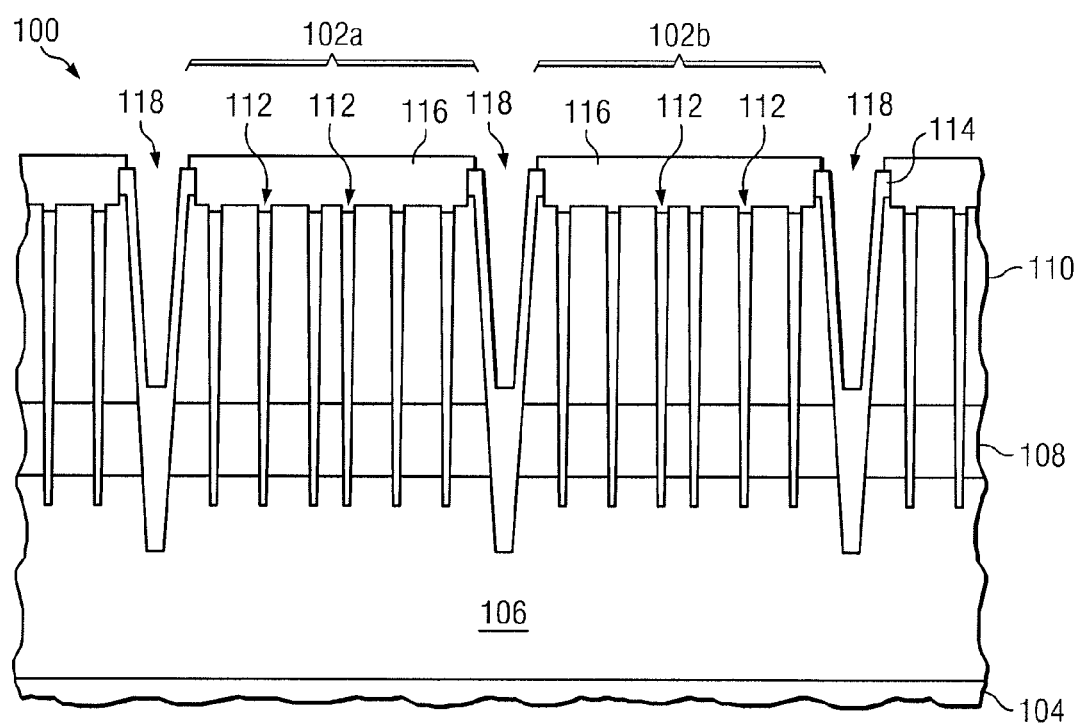
FIG. 1B illustrates a cross-section of the example embodiment infrared detectors of FIG. 1A.
Figure 1C:
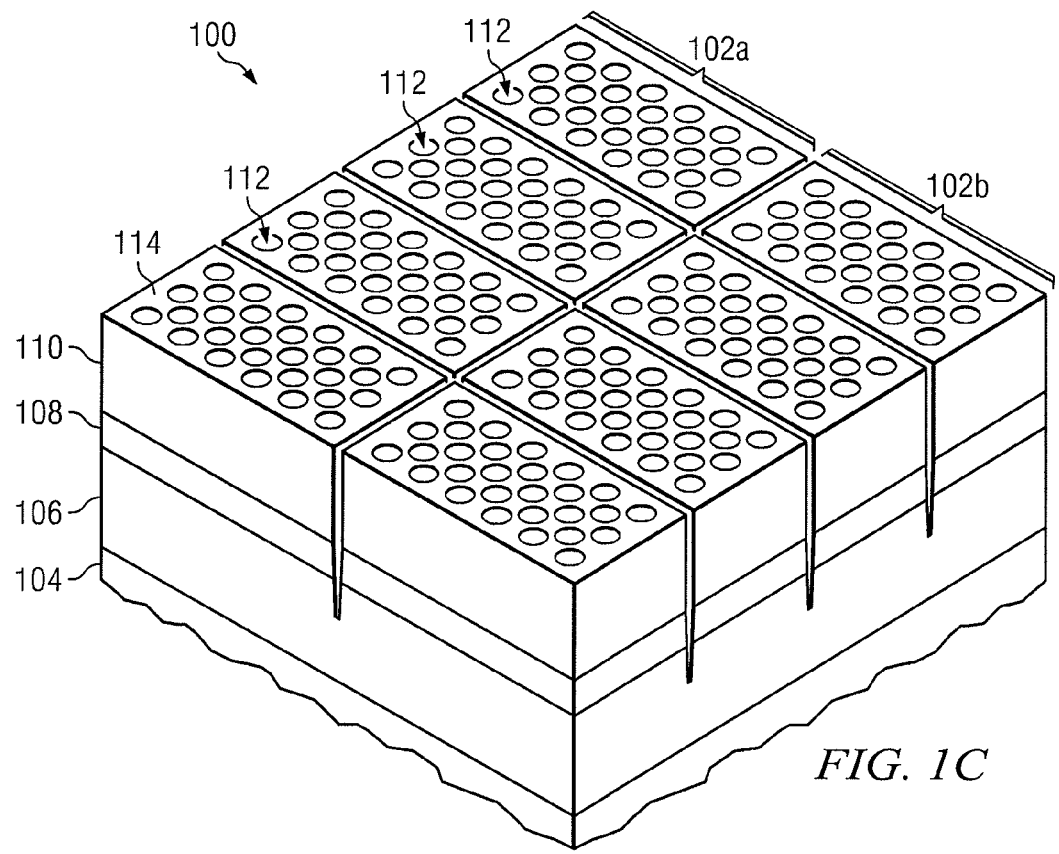
FIG. 1C is a perspective view illustrating a pattern of volume reduction of the example embodiments of the infrared detectors of FIG. 1A.

FIGS. 1A through 1C illustrate portions of a focal-plane array (FPA) 100 of infrared detectors 102 at various stages of formation according to one example embodiment. In particular, FIG. 1A illustrates a perspective view of eight infrared detectors 102a, 102b, 102c, 102d, 102e, 102f, 102g, and 102h of FPA 100. Although this example includes eight infrared detectors 102a-102h, any desired number of detectors can be used without departing from the scope of the present disclosure. In various embodiments, each infrared detector 102 may be capable of reduced noise, multi-band, infrared detection. Additionally, each infrared detector 102 may be functional at higher operational temperatures than the operational temperature ranges of conventional infrared detectors. For example, particular embodiments may be capable of broadband infrared detection at an operational temperature at or below that of liquid nitrogen (approximately 77 Kelvin) and up to an operating temperature within the range of approximately 200 to 250 Kelvin. Although FIG. 1A illustrates a two-dimensional array of at least eight infrared detectors 102, FPA 100 may include any suitable number of infrared detectors 102 arranged in one, two or three dimensions. Additionally, each infrared detector 102 may have any shape and dimension suitable for radiation detection.

FIG. 1B illustrates a cross-section of two infrared detectors 102a and 102b of FPA 100. In this example, each infrared detector 102 includes multiple semiconductor layers 106, 108, and 110, multiple internal regions 112 disposed within at least one of the semiconductor layers 106, 108, and 110, a passivation layer 114, and a contact 116, each of which are disposed outwardly from a substrate 104. Each infrared detector 102 may be at least partially separated from each other infrared detector 102 by a gap 118 where, in certain cases, no detection or absorption occurs. As explained further below, the volume reduction of selective portions of semiconductor layers 106, 108, and/or 110 may, in various embodiments, mitigate noises and/or enable operation of FPA 100 at higher temperatures without compromising the performance of multi-band, infrared detection. Although particular embodiments may include at least three semiconductor layers 106, 108, and 110, multiple internal regions 112 disposed within at least one of the semiconductor layers 106, 108, and 110, a passivation layer 114, and a contact 116, alternative embodiments may include all, some, or none of these layers. Additionally, alternative embodiments may include any suitable number of additional and/or alternative layers including, for example, one or more interstitial layers that may or may not be capable of optical absorption and/or optical transmission.

Figure 2:
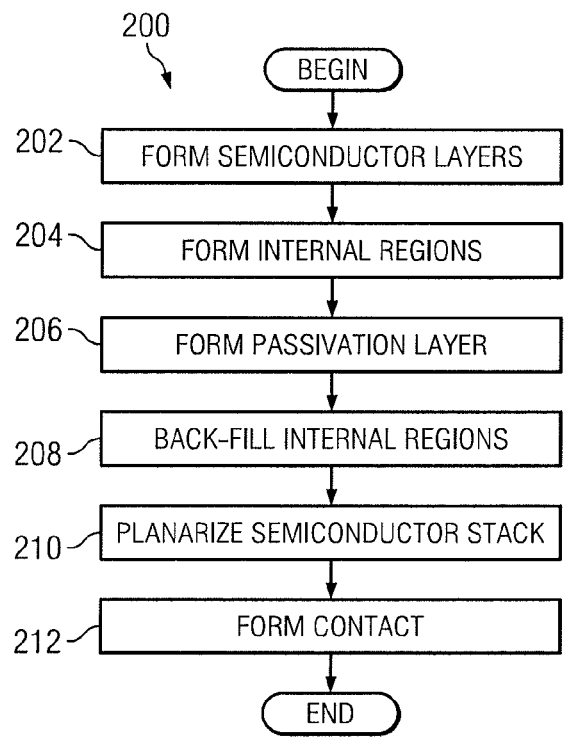
FIG. 2 is a flowchart illustrating one example embodiment of a process that may be used to form the infrared detectors of FIG. 1A.

FIG. 2 is a flowchart 200 illustrating one example embodiment of a processes that may be used to form infrared detectors 102. In step 202, multiple semiconductor layers 106, 108, and/or 110 are formed. Referring to FIG. 1A, one or more substrates 104 may provide a base upon which semiconductor layers 106, 108, and/or 110 may be formed. In particular embodiments, substrate 104 may be a wafer comprised of silicon (Si), germanium (Ge), cadmium telluride (CdTe), cadmium zinc telluride (CdZnTe), gallium arsenside (GaAs), and/or any other suitable substrate 104 or combination of substrates 104 upon which semiconductor layers 106, 108, and/or 110 may be formed. In various embodiments, substrate 104 may be configured to nearly match the lattice parameter of outwardly formed semiconductor layers 106, 108, and/or 110. In certain embodiments, substrate 104 may be removed at some point to facilitate radiation detection by FPA 100.

In particular embodiments, semiconductor layers 106, 108, and/or 110 may be formed by epitaxy. For example, molecular beam epitaxy may be used to enable a stack of semiconductor layers 106, 108, and/or 110 having different alloy compositions. The varying alloy compositions may allow simultaneous radiation detection at multiple spectral regions. In addition, molecular beam epitaxy may allow growth on large area substrates. Although particular embodiments are explained in the context of molecular beam epitaxy, any suitable processing techniques, including future processing techniques, may be used to form semiconductor layers 106, 108, and/or 110 outwardly from substrate 104. For example, in alternative embodiments a metalorganic vapor phase epitaxy and/or a liquid phase epitaxy may be used.

At least two of the semiconductor layers 106, 108, and 110 may comprise material having energy bandgaps responsive to radiation in respective spectral regions. In a particular embodiment, semiconductor layer 106 may have an energy bandgap responsive to a spectral ranger of approximately 5 microns to 0.5 micrometers, and semiconductor layer 110 may have an energy bandgap responsive to a different spectral region, such as, for example, long-wavelength infrared (LWIR). In alternative embodiments, semiconductor layers 106, 108, and/or 110 may be responsive to respective ones or more of near-infrared (NIR), short-wavelength infrared (SWIR), mid-wavelength infrared, LWIR, very-long wave infrared (VLWIR), and/or one or more other spectral regions that may or may not be within the infrared spectrum. As used herein, NIR radiation includes a spectral region extending from approximately 0.5 to 1 micrometers, SWIR radiation includes a spectral region extending from approximately 1 to 3 micrometers, MWIR radiation includes a spectral region extending from approximately 3 to 8 micrometers, LWIR radiation includes a spectral region extending from approximately 8 to 12 micrometers, and VLWIR radiation includes a spectral region extending from approximately 12 to 30 micrometers.

One example material capable of detecting radiation is mercury cadmium telluride (HgCdTe). In a particular embodiment, semiconductor layers 106, 108, and/or 110 at least partially comprises HgCdTe in the form of $Hg_{(1-x)}Cd_xTe$. The x value of the HgCdTe alloy composition may be chosen, for example, so as to tune the optical absorption of the corresponding semiconductor layer 106, 108, and/or 110 to the desired infrared wavelength. In a particular embodiment, layer 106 may be comprised of $Hg_{0.55}Cd_{0.45}Te$ and layer 108 may be comprised of $Hg_{0.7}Cd_{0.3}Te$; however, the x of $Hg_{(1.0-x)}Cd_xTe$ for layers 106, 108, and/or 110 may be any suitable value depending, for example, on the desired range of optical absorption. In alternative embodiments, layers 106, 108, and/or 110 may comprise additional and/or alternative materials responsive to radiation. For example, layers 106, 108, and/or 110 may comprise mercury cadmium zinc telluride (HgCdZnTe) and/or III-V semiconductor materials, such as, for example, GaAs, AlGaAs, InAs, InSb, GaSb, and their alloys. As another example layers 106, 108, and/or 110 may be based on a type-II strained-layer superlattice structure.

In various embodiments, semiconductor layers 106, 108, and/or 110 may have respective types of electrical conductivity. For example, semiconductor layers 106 and 110 may each be n-type and semiconductor layer 108 may be p-type, thereby creating an n-p-n polarity. As another example, semiconductor layers 106 and 110 may be p-type and semiconductor layer 108 may be n-type, thereby creating a p-n-p polarity. A variety of other suitable electrical conductivity variations may be used for semiconductor layers 106, 108, and/or 110 including, for example, combinations that include additional or fewer semiconductor layers. Referring to the alternative embodiment illustrated in FIG. 3, layers 306 and 310 may be n-type layers substantially similar in structure and function to various embodiments of semiconductor layers 106 and 110, respectively, and layer 308 may be a p-type capping layer substantially similar in structure and function to various embodiments of semiconductor layer 108. Any suitable dopant and dopant concentration may be used to render semiconductor layers 106, 108, 110, 306, 308, and/or 310 either n-type or p-type.

In step 204, internal regions 112 are formed within one or more of semiconductor layers 106, 108, and/or 110 at least in part by reducing the volume of the corresponding layer or layers. For example, portions of semiconductor layer 106, 108, and/or 110 may be selectively removed. In a particular embodiment, the portions may be selectively removed by photolithography and etching; however, any suitable volume reduction process or combination of processes may be used. The volume reduction of semiconductor layers 106, 108, and/or 110 may be configured in a periodic pattern designed to affect the motions of photons through the corresponding semiconductor layers 108, 108, and/or 110. In this manner, internal regions 112 may be capable of causing a resonant effect upon the particular semiconductor layers 106, 108, and/or 110 within which internal regions 112 may be disposed. Thus, even though volume may be removed from one or more photon detecting regions of semiconductor layers 106, 108, and/or 110, these reduced-volume regions may still be capable of resonating in such a way as to absorb sufficient photons in the active material for accurate radiation detection.

FIG. 1C is a perspective view illustrating a number of internal regions 112 formed in a pattern within the infrared detectors 102a, 102b, 102c, 102d, 102e, 102f, 102g, and 102h of FPA 100 according to one embodiment. In this example, each detector 102 comprises 28 internal regions 112 arranged in a photonic crystal pattern. Using one or more photonic crystal patterns for internal regions 112 may, in certain cases, compensate for the volume reduction of one or more photon absorbing regions of semiconductor layers 106, 108, and/or 110. For example, the one or more photonic crystal patterns may affect the propagation of electromagnetic waves through the volume-reduced absorbing regions of semiconductor layers 106, 108, and/or 110 in a manner that facilitates photon absorption. Although this example includes 28 internal regions 112 having rounded openings arranged in a photonic crystal pattern, any suitable shape or shapes (e.g., rectangular, square, octagonal, oval, diamond, etc.) and/or patterns may be used. Additionally, alternative embodiments may include an array of radiation detectors 102 that have respective internal regions 112 configured differently from other radiation detectors 102 of the same array.

In various embodiments, internal regions 112 may each generally extend along an axis substantially perpendicular to one or more planar surfaces of semiconductor layers 106, 108, and/or 110. As shown in FIG. 1A, for example, each internal region 112 extends from an outwardly disposed surface of semiconductor layer 110, through an inwardly disposed surface of semiconductor 110, through outwardly and inwardly disposed surfaces of semiconductor layer 108, and at least partially into semiconductor layer 106. Although each internal region 112 extends continuously through portions of semiconductor layers 106, 108, and 110 in the illustrated embodiments, in alternative embodiments, semiconductor layers 106, 108, and/or 110 may comprise respective internal regions 112 that are not continuous with internal regions 112 of other ones of the semiconductor layers 106, 108, and/or 110. Additionally, some or all of internal regions 112 may extend through some, all, or none of semiconductor layers 106, 108, and/or 110.

In various embodiments, internal regions 112 may be disposed at least within the semiconductor layer 106, 108, and/or 110 having the longest wavelength bandgap absorption of the semiconductor stack 106, 108, and 110. Accordingly, formation of internal regions 112 within each detector 102 of FPA 100 may, in certain cases, result in volume reduction of the longest wavelength band absorption region of FPA 100. The volume reduction of this longest wavelength band absorption region may provide a number of advantages. For example, reducing the volume of the longest wavelength band absorption region may reduce a variety of noises that might otherwise be generated by this region. In particular, noise due to diffusion and generation-recombination currents, or diffusion and g-r noise, may be types of electrical signal noise that may be reduced by internal regions 112. Additionally, 1/f noise sources may be reduced by the volume reduction achieved by internal regions 112. The term 1/f noise as used herein generally refers to any noise with a power spectral density of the form $S(f) \propto 1/f^\alpha$, where f is frequency and $0<\alpha<2$, with a usually close to 1. A variety of other types of noises associated with conventional infrared detectors may also be mitigated by the formation of internal regions 112 within the longest wavelength band absorption region of FPA 100.

In certain embodiments, the volume reduction of semiconductor layers 106, 108, and/or 110 may result in an increased surface area and an increased surface-to-volume ratio of the volume-reduced semiconductor layers 106, 108, and/or 110. The increased surface area and surface-to-volume ratio may compound the risk of recombination and/or carrier loss, potentially resulting in high noise current and a variety of other issues.

In step 206, passivation layer 114 is formed outwardly from portions of FPA 100. As shown in FIG. 1B, for example, passivation layer 114 may be formed outwardly from substantially all exposed surfaces of semiconductor layers 106, 108, and/or 110. In particular embodiments, passivation layer 114 may at least partially fill the voids of each internal region 112. The passivation of these exposed surfaces including, for example, the exposed surfaces of internal regions 112 may, in certain cases, mitigate the risk of recombination and/or carrier loss. According to one embodiment, passivation layer 114 may comprise a wide bandgap Group II-VI material, such as, for example, cadmium telluride (CdTe). However, passivation layer 114 may comprise of any suitable material, material stack, and/or combinations of materials.

In step 208, internal regions 112 may be wholly or partially back-filled. For example, the remainder of the voids of each internal region 112 may be at least partially filled. In particular embodiments, the void-filling material or materials may have respective refractive indices that differ from respective refractive indices of the particular semiconductor layers 106, 108, and/or 110 within which internal regions 112 may be disposed. For example, as mentioned previously with reference to step 206, the voids may be wholly or partially filled by passivation layer 114. Additionally or alternatively, the voids may be wholly or partially filled by one or more other layers, such as, for example, an organic polymer (e.g., photoresist), an oxide (e.g., silicon dioxide), a nitride (e.g., silicon nitride), and/or any other suitable filler layer. In various embodiments, all of or a portion of the voids may remain unfilled, leaving an air gap disposed within internal regions 112. In another embodiment, each void may at least partially define an enclosed area filled with one or more gases and/or substantially free of matter (e.g., a vacuum). In certain embodiments, wholly or partially filled internal regions 112 may have refractive indices and/or the dielectric constants differing from that of the refractive indices and/or dielectric constants of the particular semiconductor layers 106, 108, and/or 110 within which internal regions 112 may be disposed. These differences in refractive indices and/or dielectric constants may, in certain cases, have a beneficial resonant effect upon photons moving through semiconductor layers 106, 108, and/or 110.

In step 210, the outmost surface of the semiconductor layer stack may be planarized. As shown in FIG. 1A, for example, the outermost surface of semiconductor layer 110 may be etched back to provide a more planar surface. In particular embodiments, planarization may additionally or alternatively include forming one or more respective microeletricromechanical systems (MEMS) outwardly from each internal region 112. For example, each internal region 112 may have a MEMS cap or bridge formed outwardly from a sacrificial material disposed within the internal region 112. The sacrificial material may then be wholly or partially removed, leaving in its place an air gap disposed inwardly from the undercut MEMS structure. In this manner, internal regions 112 may each have a respective air gap and yet the outermost semiconductor layer 106, 108, and/or 110 may nevertheless provide a substantially planar surface.

In step 212, a respective contact 116 is formed outwardly from each infrared detector 102. In particular embodiments, each contact 116 may enable the corresponding infrared detector 112 to electrically communicate a signal to readout circuitry, as explained further below with reference to FIG. 3. Contacts 116 may be comprised of any suitable electrical conductor including, for example, nickel, gold, copper, etc. In certain embodiments, contacts 116 may be formed by conventional photolithographic processes; however, any formation technique may be used. In various embodiments, additional contacts may be formed, as will be appreciated by those skilled in the art. For example, a ground contact (not explicitly shown) may be formed at an edge of FPA 100, which may provide an electrical ground connection to one or more of semiconductor layers 106, 108, and/or 110.

In operation, at least two of semiconductor layers 106, 108, and/or 110 may be capable of radiation detection when a photon of sufficient energy kicks an electron from the valence band to the conduction band within one of these layers. Such an electron is collected by a suitable external readout integrated circuits (ROIC) and transformed into an electric signal. In particular embodiments, FPA 100 may also refer to and include the physical mating of the detector array to the ROIC, as explained further with reference to FIG. 3.

Figure 3:
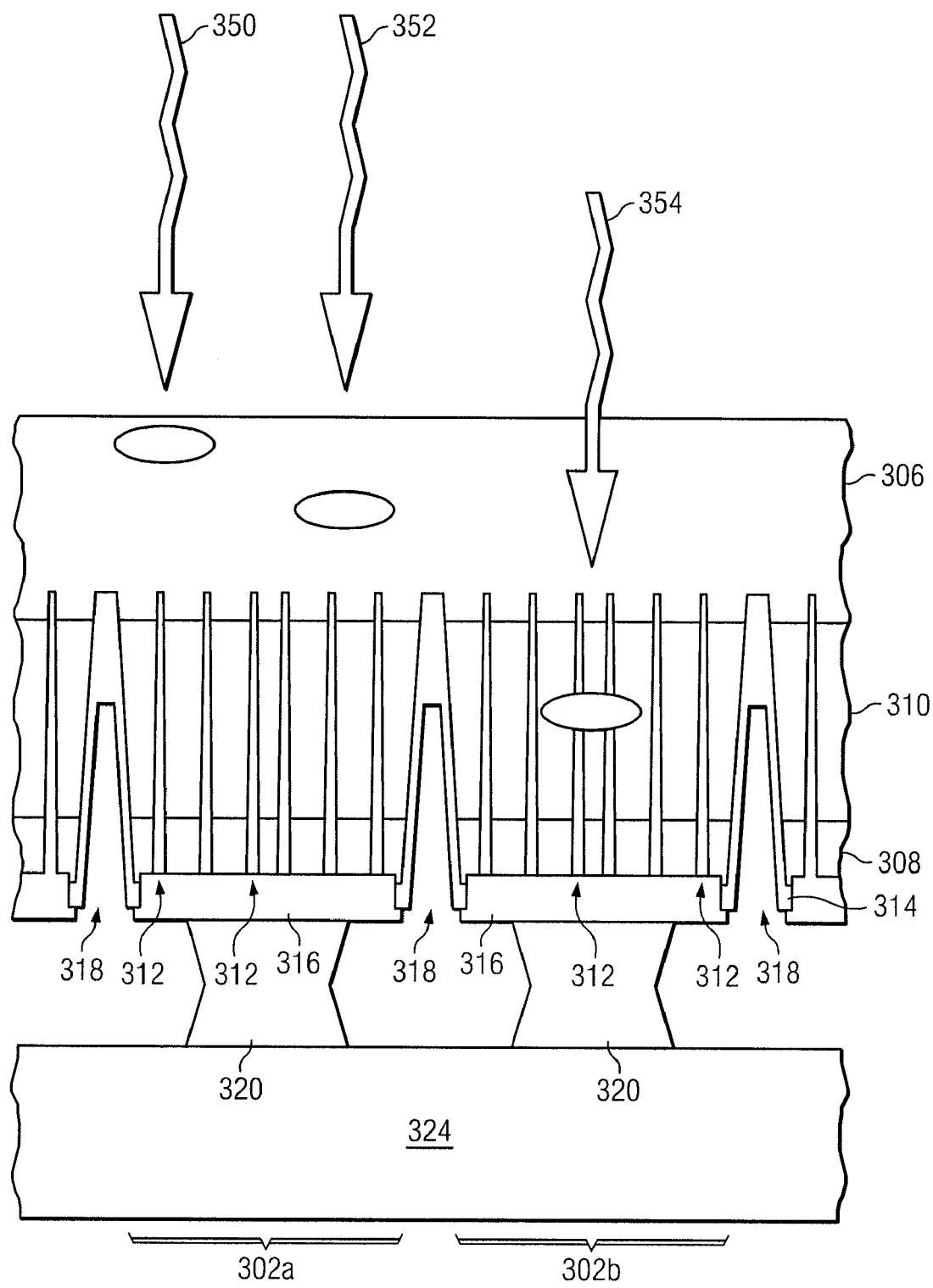
FIG. 3 illustrates an example alternative embodiment of a cross-section of a portion of a focal-plane array of multi-band, reduced-volume, infrared detectors.

FIG. 3 illustrates a cross-section of a portion of a focalplane array (FPA) 300 of multi-band, reduced-volume, infrared detectors 302 according to an alternative embodiment. In this example, a respective conductive connector 320 (e.g., an indium bump) electrically and physically couples each infrared detector 302 to an ROIC 324. The operation of FPA 300 may be explained in the context of three different beams of light 350, 352, and 354 having respective wavelengths impinge upon FPA 300. Semiconductor layer 306 of infrared detector 302a may be capable of absorbing photons from light beams 350 and 352. Light beam 354 may radiate through semiconductor layer 306 to semiconductor layer 310, where photons of light beam 354 are absorbed by infrared detector 302b. As a result of the photon absorptions, ROIC 324 is capable of detecting the corresponding electrons kicked to the conduction band from respective infrared detectors 302. Thus, particular embodiments may be capable of absorption of two different photon energies in two different regions of a single infrared detector 302.

In a particular embodiment, layers 306 and 310 may be n-type layers substantially similar in structure and function to various embodiments of semiconductor layers 106 and 110, respectively, and layer 308 may be a p-type capping layer substantially similar in structure and function to various embodiments of semiconductor layer 108. Thus, the semiconductor stack may, in certain embodiments, include an n-type semiconductor layer 310 disposed between another n-type semiconductor layer 306 and a p-type semiconductor layer 308. In certain embodiments, internal regions 312, layer 314, and contact 316, may be substantially similar in structure and function to internal regions 112, passivation layer 114, and contact 316, respectively, of FIG. 1B.

Accordingly, particular embodiments may be capable of broadband radiation detection. In certain embodiments, two different regions of a radiation detector may have respective, differing bandgaps. The volume of the noiser bandgap region may be reduced, thereby potentially reducing the noise contribution of the dominant noise source. In some embodiments, the volume of other regions may also be reduced, even though such regions may or may not be a diffusion noise source. For example, FPAs 100 and 300 both illustrate volume reduction of layers 108 and 308, though such layers may or may not be a diffusion noise source. Even though material of an absorption region may be removed in some embodiments, detector performance may be maintained, or even improved in some cases, by the inclusion of a pattern of internal regions 112 that affect the resonance of the volume-reduced absorption region. In particular embodiments, a photonic crystal pattern may be used for the internal regions 112. In addition to potential noise reduction, various radiation detectors may be functional at higher operational temperatures than the operational temperature ranges of conventional infrared detectors. As disclosed above, particular embodiments may be capable of broadband infrared detection at an operating temperature within the range of approximately 200 to 250 Kelvin, depending on the wavelength of detection.

The components of the systems and apparatuses disclosed herein may be integrated or separated. Moreover, the functions of the elements and/or layers may be performed by more, fewer, or other components. For example, particular embodiments may include one or more filtering layers and/or one or more diffraction gratings. As another example, particular embodiments may include only two semiconductor layers. The methods may include more, fewer, or other steps. For example, steps 206 and 208 may be combined in a single step that includes the formation of passivation layer 114 within internal regions 112. Additionally, steps may be performed in any suitable order. Particular operations of the systems and apparatuses disclosed herein may be performed using any suitable logic embodied in computer-readable media. As used in this document, "each" refers to each member of a set or each member of a subset of a set.

Although the present disclosure has been described above in connection with several embodiments, a myriad of changes, substitutions, variations, alterations, transformations, and modifications may be suggested to one skilled in the art, and it is intended that the present invention encompass such changes, substitutions, variations, alterations, transformations, and modifications as fall within the spirit and scope of the appended claims. For example, in various alternative embodiments one or more infrared detectors may be formed be reducing the volumes of multiple semiconductor layers, such that a pattern of pillars substantially similar in dimensions to internal regions 112 remain and such that the semiconductor volume surrounding the pillars is selectively removed. The pillars may have a configuration substantially similar to a photonic crystal pattern. In certain embodiments, the pillars may be wholly or partially encased by one or more outwardly disposed layers, such as, for example, one or more passivation layers.

To aid the Patent Office, and any readers of any patent issued on this application in interpreting the claims appended hereto, applicants wish to note that they do not intend any of the appended claims to invoke paragraph 6 of 35 U.S.C. §112 as it exists on the date of filing hereof unless the words "means for" or "step for" are explicitly used in the particular claim.

What is claimed is:

1. A broadband radiation detector comprising:
a first layer having a first electrical conductivity type;
a second layer having a second electrical conductivity type and an energy bandgap responsive to radiation in a first spectral region comprising a first plurality of wavelengths;
a third layer having the second electrical conductivity type and an energy bandgap responsive to radiation in a second spectral region comprising at least one wavelength that is longer than each of the first plurality of wavelengths of the first spectral region; and
a plurality of internal regions, each of the plurality of internal regions disposed at least partially within the third layer, and each of the plurality of internal regions comprising a refractive index that is different from a refractive index of the third layer;
wherein the plurality of internal regions are arranged according to a regularly repeating pattern.

2. The broadband radiation detector of claim 1, wherein each of the plurality of internal regions comprises one or more spacers selected from the group consisting of an organic polymer, a silicon compound, and an air gap; and
wherein the broadband radiation detector is responsive to infrared (IR) radiation within at least two spectral wavelength ranges selected from the group consisting of:
approximately 0.1 to less than 0.5 micrometers;
approximately 0.5 to less than 1 micrometers;
approximately 1 to less than 3 micrometers;
approximately 3 to less than 8 micrometers;
approximately 8 to less than 12 micrometers; and
approximately 12 to less than 30 micrometers.

3. The broadband radiation detector of claim 1, wherein the broadband radiation detector is one of a plurality of broadband radiation detectors arranged in an array having a single focal plane.

4. The broadband radiation detector of claim 1, wherein the first layer comprises a p-type material and the second and third layers comprise n-type materials.

5. The broadband radiation detector of claim 1, wherein the broadband radiation detector is capable of broadband infrared detection at operating temperatures up to approximately 250 Kelvin.

6. The broadband radiation detector of claim 1, wherein the first layer is disposed between the second and third layers.

7. The broadband radiation detector of claim 1, wherein the third layer is disposed between the first and second layers.

8. The broadband radiation detector of claim 1, wherein each of the plurality of internal regions extends at least from a first surface of the third layer, through the third layer, and to a second surface of the third layer.

9. The broadband radiation detector of claim 8, wherein each of the plurality of internal regions extends at least partially into the first layer.

10. The broadband radiation detector of claim 8, wherein each of the plurality of internal regions extends at least partially into the second layer.

11. The broadband radiation detector of claim 1, wherein each of the plurality of internal regions extends into portions of the first layer, the second layer, and the third layer; and
wherein the broadband radiation detector is capable of detecting a photon that passes through each of the first layer, the second layer, and the third layer.

12. A method of forming a broadband radiation detector, the method comprising:
forming a first layer having a first electrical conductivity type;
forming a second layer having a second electrical conductivity type and an energy bandgap responsive to radiation in a first spectral region comprising a first plurality of wavelengths;
forming a third layer having the second electrical conductivity type and an energy bandgap responsive to radiation in a second spectral region comprising at least one wavelength that is longer than each of the first plurality of wavelengths of the first spectral region;
selectively removing portions of at least the third layer to at least partially form a plurality of internal regions, wherein the plurality of internal regions are arranged according to a regularly repeating pattern; and
at least partially filling each of the plurality of internal regions with a passivation layer having a refractive index that is different from a refractive index of the third layer.

13. The method of claim 12, further comprising at least partially filling respective remainders of each of the plurality of internal regions with a material having a dielectric constant that is different from the dielectric constant of the third layer.

14. The method of claim 12, wherein the broadband radiation detector is responsive to infrared (IR) radiation within at least two spectral wavelength ranges selected from the group consisting of:
approximately 0.1 to less than 0.5 micrometers;
approximately 0.5 to less than 1 micrometers;
approximately 1 to less than 3 micrometers;
approximately 3 to less than 8 micrometers;
approximately 8 to less than 12 micrometers; and
approximately 12 to less than 30 micrometers.

15. The method of claim 12, further comprising forming a plurality of the broadband radiation detectors in an array arrangement having a single focal plane.

16. The method of claim 12, wherein the first layer comprises a p-type material and the second and third layers comprise respective n-type materials.

17. The method of claim 12, further comprising:
selectively removing portions from one or more of the first layer and the second layer, each portion selectively removed from the one or more of the first layer and the second layer corresponding to a respective one of the portions selectively removed from the third layer; and
at least partially filling, with the passivation layer, each portion selectively removed from the one or more of the first layer and the second layer.

18. An array of multi-band radiation detectors arranged in an array having a single focal plane, each multi-band radiation detector comprising:
a first layer having a first electrical conductivity type;
a second layer having a second electrical conductivity type and an energy bandgap responsive to radiation in a first spectral region comprising a first plurality of wavelengths;
a third layer having the second electrical conductivity type and an energy bandgap responsive to radiation in a second spectral region comprising at least one wavelength that is longer than each of the first plurality of wavelengths of the first spectral region;
a plurality of internal regions, each of the plurality of internal regions disposed within the third layer and at least a portion of the first layer, and each of the plurality of internal regions comprising one or more dielectric constants that are each higher than a dielectric constant of the third layer; and
a plurality of metallic contacts each disposed outwardly from the plurality of internal regions of respective ones of the array of multi-band radiation detectors;

wherein the plurality of internal regions are arranged according to a regularly repeating pattern; and wherein the second and third layers are responsive to infrared (IR) radiation within respective ones or more of a plurality of spectral wavelength ranges selected from the group consisting of:

approximately 0.1 to less than 0.5 micrometers;
approximately 0.5 to less than 1 micrometers;
approximately 1 to less than 3 micrometers;
approximately 3 to less than 8 micrometers;
approximately 8 to less than 12 micrometers; and
approximately 12 to less than 30 micrometers.

19. The array of multi-band radiation detectors of claim 18, wherein each of the plurality of internal regions comprises one or more spacers selected from the group consisting of a passivation layer, a layer comprising a silicon compound, and an air gap.

20. The array of multi-band radiation detectors of claim 18, further comprising a plurality of microelectrical mechanical system (MEMS) structures each disposed outwardly from respective ones of the plurality of internal regions.

* * * * *